United States Patent [19]
Douglas

[11] Patent Number: 6,073,748
[45] Date of Patent: Jun. 13, 2000

[54] MULTIPLE LANE INVERTER

[75] Inventor: John J. Douglas, Lynch Station, Va.

[73] Assignee: Simplimatic Engineering Company, Lynchburg, Va.

[21] Appl. No.: 09/338,634

[22] Filed: Jun. 23, 1999

[51] Int. Cl.$^7$ .................................................. B65G 15/00
[52] U.S. Cl. ........................................... 198/404; 198/403
[58] Field of Search .................................. 198/402, 403, 198/404, 379

[56] References Cited

U.S. PATENT DOCUMENTS

| | | | |
|---|---|---|---|
| 4,009,775 | 3/1977 | Wolfelsperger et al. | 198/403 |
| 4,354,788 | 10/1982 | Giusti | 198/404 X |
| 4,798,278 | 1/1989 | Cornacchia | 198/399 |
| 4,854,081 | 8/1989 | Pola et al. | 51/76 R |
| 4,969,552 | 11/1990 | Kennicutt et al. | 198/399 |
| 5,009,306 | 4/1991 | Roderick et al. | 198/414 |
| 5,259,495 | 11/1993 | Douglas | 198/404 |
| 5,297,568 | 3/1994 | Schmid | 198/404 X |
| 5,529,081 | 6/1996 | Kappler | 134/64 R |
| 5,637,148 | 6/1997 | Kuster et al. | 118/64 |

FOREIGN PATENT DOCUMENTS

| | | | |
|---|---|---|---|
| 4-49112 | 2/1992 | Japan | 198/404 |

*Primary Examiner*—James R. Bidwell
*Attorney, Agent, or Firm*—St. Onge Steward Johnston & Reens LLC

[57] ABSTRACT

An inverter for flipping articles traveling on a conveyor system is provided. The inverter includes a flipping member which has a plurality of substantially parallel lanes defined by side walls. The flipping member is attached to a frame member such that the flipping member is rotatable with respect to the frame member about an axis substantially perpendicular to the lanes. A pair of belts circulates around a pair of belt paths on each of the side walls defining the lanes, each of the belt paths being defined by a plurality of rollers mounted on one of the side walls. Each pair of belts defines an article conveying channel for securing therebetween one of the side edges of the article being conveyed. One of the rollers defining one of the belt paths of each pair of belt paths is operatively attached to one of a pair of cooperating gears, the other of which is operatively attached to one of the rollers defining the other belt path of the pair of belt paths such that if one belt of a pair of belts is driven, the other belt of the pair of belts is driven at substantially the same velocity, but in an opposite direction. A plurality of drive motors are mounted on the flipping member, each of the drive motors driving one belt of each pair of belts.

17 Claims, 4 Drawing Sheets

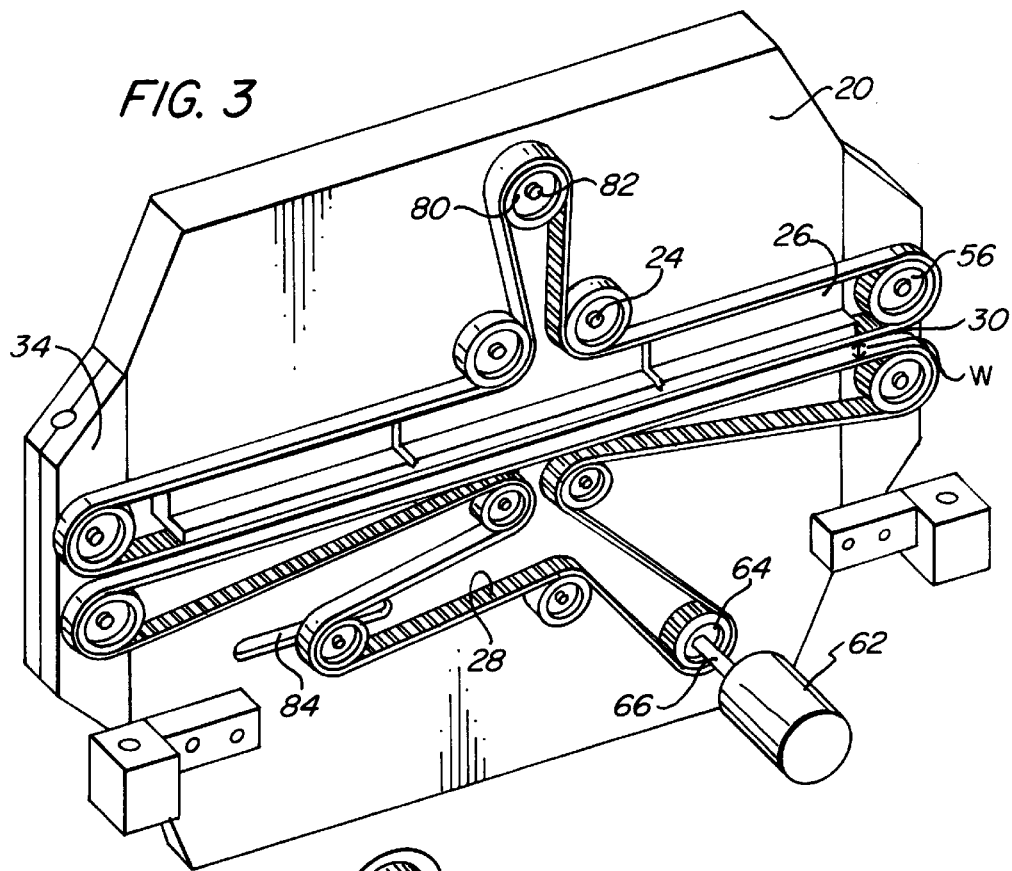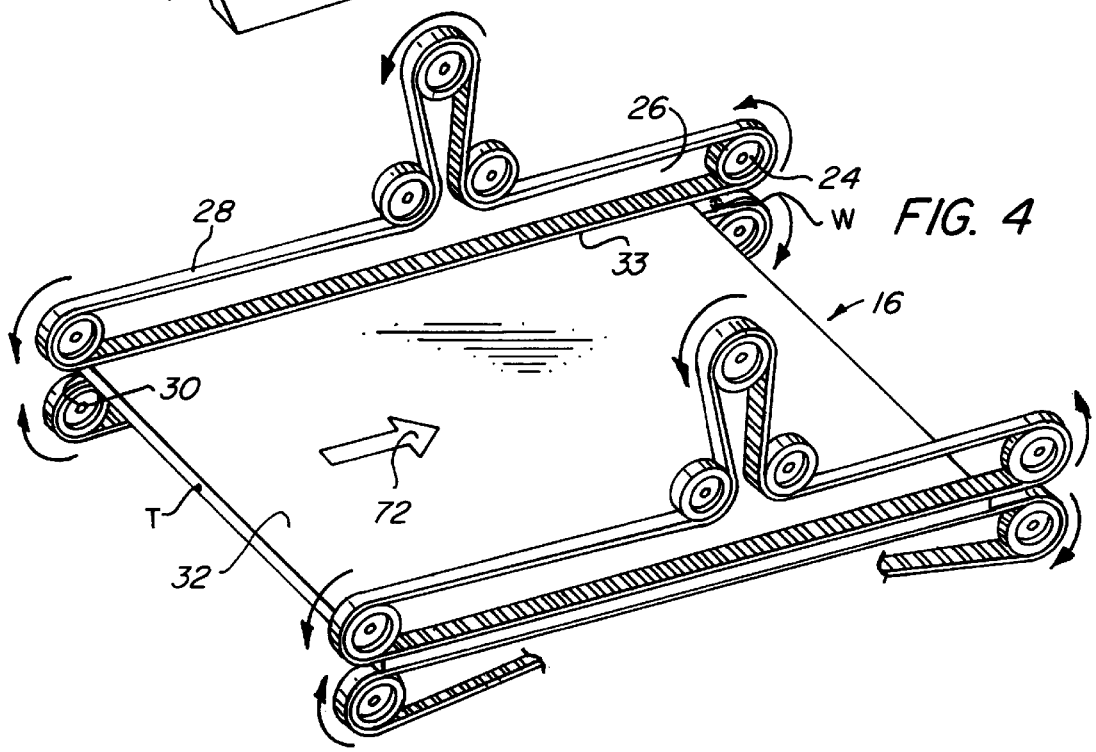

MULTIPLE LANE INVERTER

FIELD OF THE INVENTION

The invention relates to devices and methods for conveying and manipulating articles, and more particularly, to a device, for use in a conveyor system having two or more side-by-side driven lanes, which is capable of flipping articles so that the downward facing sides of the articles are caused to face upward so that they can be manipulated by other components of an assembly line.

BACKGROUND OF THE INVENTION

In the industry involving high speed automated handling of printed circuit boards, the boards typically are moved from station to station for step-wise performance of functions such as mounting components on opposite sides of the board, testing the components, soldering, and the like. It is therefore often necessary after operating on an upper surface of the boards at one station to flip the boards so as to operate on the lower surface thereof at the next station. Numerous devices for inverting printed circuit boards travelling along a conveyor line to achieve this flipping are known.

U.S. Pat. No. 4,969,552 to Kennicutt et al. discloses a device for flipping circuit boards which includes two U-shaped channels 70 which receive opposite edges of the board. The outer peripheries of feed wheels 60, which are driven by motor 50 via belt 56, protrude into channels 70 to engage and drive the board into and out of the flipping device. The complex flipping operation involves lifting one end of channels 70 and flipping it end-over-end, while at the same moving the opposite end of channels 70 in a horizontal plane toward the original position of the first end.

The device disclosed in Kennicut et al, however, has a number of disadvantages. As printed circuit board technology advances and the size of the boards themselves and the components mounted thereon decreases, the printed circuit boards are becoming more and more fragile. Inverters such as those disclosed in Kennicutt et al., which lift the boards completely off of the drive rollers, can easily damage the fragile boards. Another problem associated with the decreasing size of printed circuit boards and associated components is that more precise placement of the boards along the conveyor lines is necessary for proper manipulation of the board faces. The Kennicutt et al. device which lifts the boards off the assembly line during inversion thereof may not meet the demanding precision requirements.

U.S. Pat. No. 5,297,568 to Schmid discloses a device for treatment of printed circuit boards which includes a turning over mechanism 16. Mechanism 16 includes a conveying means 32 which comprises two endless belts 34, 35 which are drivable in opposite directions to secure the circuit boards 23 therebetween. During operation, conveying means 32 moves board 23 horizontally until the entire board 23 is within mechanism 16, at which point mechanism 16 rotates conveying means 32 and board 23 about a horizontal axis 46a, b, c. Conveying means 32 then causes board 23 to exit the opposite end of mechanism 16.

Although Schmid does not suffer from the disadvantages discussed above, the device disclosed in Schmid suffers from its own disadvantages. Schmid discloses two endless belts, one above and one below the board, drivable in opposite directions for securing the board therebetween. However, nothing is disclosed as to how the two belts are driven. The drive of the belts is critical because if the speed of the two belts is not substantially identical, the boards may become misaligned, thereby possibly causing damage to the board, jamming of the conveyor, or failure to maintain precise tolerances along the assembly line. Schmid does not disclose any means to maintain the necessary precise timing of the belts.

Furthermore, neither of the prior art patents discussed above discloses an inverter which can be used in a conveyor system having two side-by-side driven lanes. Such a dual lane conveyor system is desirable to increase production and efficiency of the assembly line by effectively doubling the number of printed circuit boards which can be processed in any given time period. However, a major concern of dual lane conveyor systems is the space required for such systems, particularly when a single lane conveyor, or a portion thereof, is being replaced by a dual lane conveyor system. For example, to minimize the width of the conveyor system as a whole, and the inverter in particular, it is desirable to have a space of less than approximately two inches between the two lanes. Neither of the prior art patents discussed above recognizes that the width of a flipping device is critical, and thus neither is concerned with minimizing the width of the device. As such, neither of the patents discloses a device which can meet the demanding width requirements of a dual lane conveyor system.

What is desired, therefore, is an inverter for use in a conveyor system which has two side-by-side driven lanes, which minimizes the chance of damage to the articles being flipped, which maintains precise placement of the articles, which maintains the necessary precise timing of the drive belts, which has a relatively small overall width, and which allows for a distance between the lanes of less than approximately two inches.

SUMMARY OF THE INVENTION

Accordingly, it is an object of the present invention to provide an inverter for use in a conveyor system which has two side-by-side driven lanes.

Another object of the present invention is to provide an inverter for use in a conveyor system which minimizes the chance of damage to the articles being flipped by constraining the boards to move between a pair of endless belts.

A further object of the present invention is to provide an inverter for use in a conveyor system which maintains precise placement of the articles.

Still another object of the present invention is to provide an inverter for use in a conveyor system which includes a gearing arrangement to maintain the necessary precise timing of the drive belts.

Yet a further object of the present invention is to provide an inverter for use in a conveyor system which has motors mounted horizontally within the lanes to provide lanes having a relatively small overall width.

Still yet a further object of the present invention is to provide an inverter for use in a conveyor system which allows for a distance between the lanes of less than approximately two inches.

These and other objects of the present invention are achieved by provision of an inverter for flipping articles traveling on a conveyor system. The inverter includes a flipping member which has a plurality of substantially parallel lanes defined by side walls. The flipping member is attached to a frame member such that the flipping member is rotatable with respect to the frame member about an axis substantially perpendicular to the lanes. A pair of belts circulates around a pair of belt paths on each of the side walls defining the lanes, each of the belt paths being defined by a plurality of rollers mounted on one of the side walls. Each pair of belts defines an article conveying channel for securing therebetween one of the side edges of the article being conveyed. Preferably, each of the belt paths includes a belt tensioner for inhibiting slippage of the belts.

One of the rollers defining one of the belt paths of each pair of belt paths is operatively attached to one of a pair of cooperating gears, the other of which is operatively attached to one of the rollers defining the other belt path of the pair of belt paths such that if one belt of a pair of belts is driven, the other belt of the pair of belts is driven at substantially the same velocity, but in an opposite direction. Preferably, the gears are located within the side wall to which the rollers defining each belt path are mounted, the rollers operatively attached to the gears comprise toothed rollers and the belts comprise timing belts cooperating with the toothed rollers. Most preferably, all of the rollers comprise toothed rollers, and the belts comprise timing belts cooperating with the toothed rollers.

A plurality of drive motors are mounted on the flipping member, each of the drive motors driving one belt of each pair of belts. Preferably, each of the drive motors is mounted on the flipping member within a space defined horizontally by the side walls of the lane which each motor is driving, and the drive motors rotate with the flipping member. It is also preferable that the drive motors are reversible so that an article may enter the flipping member from one end, flipping member may be rotated 180 degrees, and the article may exit the flipping member from the same end at which the article entered. Preferably, the inverter also includes a flipping motor for rotating the flipping member.

The invention and its particular features and advantages will become more apparent from the following detailed description considered with reference to the accompanying drawings.

BRIEF DESCRIPTION OF THE DRAWINGS

FIG. 3 is a perspective view of one of the walls of the inverter of FIG. 1 which defines one of the conveyor lanes;

FIG. 4 is perspective view, partially cut away, of portions of the inverter of FIG. 1 illustrating how a printed circuit board is conveyed by the inverter;

DETAILED DESCRIPTION OF THE INVENTION

Figure 1:
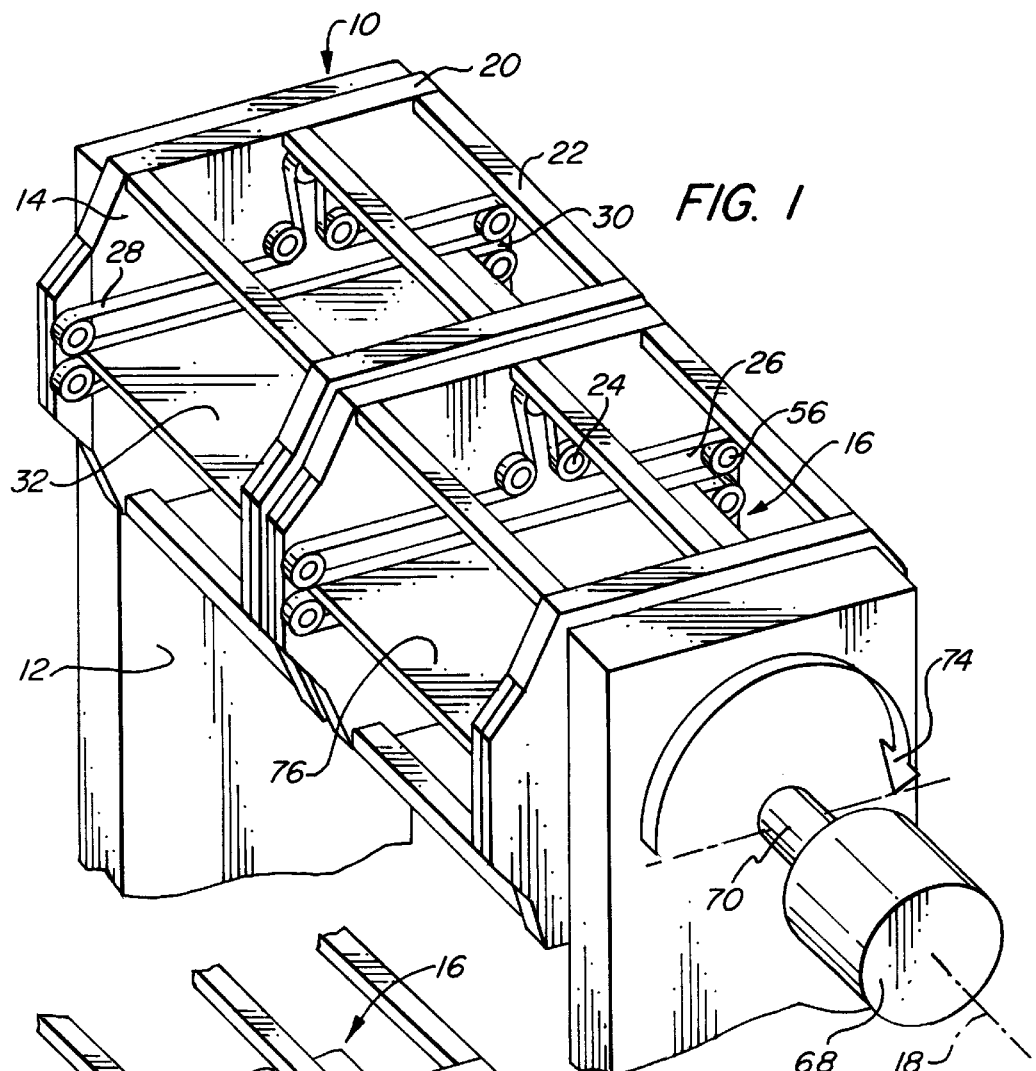
FIG. 1 is a perspective view of an inverter for flipping articles traveling on a conveyor system in accordance with the present invention.

Referring first to FIG. 1, an inverter 10 for flipping articles traveling on a conveyor system in accordance with this invention is generally shown in a perspective view. As shown, inverter 10 generally includes a frame member 12 and a flipping member 14, which includes a plurality of substantially parallel lanes 16. Although the figures and the description which follows are directed to an inverter 10 having two lanes 16, it is contemplated that inverter 10 may include more than two lanes 16 if desired. Flipping member 14 is rotatably mounted to frame member 12 such that flipping member 14 is rotatable with respect to frame member 12 about an axis 18 substantially perpendicular to lanes 16.

Each lane 16 is defined by a pair of side walls 20 which are connected by support members 22. Lanes 16 may be designed to have a constant width, as is shown in the figures, or to have a variable width. When lanes 16 are to have a constant width, both side walls 20 defining each lane 16 are rigidly affixed to support members 22. Adjustability may be accomplished, for example, by providing holes through side walls 20 which are adapted to receive support members 22 in sliding engagement. Thus, side walls 20 may be slid on support members relative to one another, thereby allowing the width of lanes 16 to be adjusted. Position anchoring means, such as set screws, may be provided to anchor side walls 20 on support members 22 at the desired lane width. Alternately, one of the pair of side walls 20 defining each lane may be rigidly affixed to support members 22, while the other side wall 20 is adjustable.

Referring now to FIGS. 3 and 4, mounted on each side wall 20 are a plurality of rollers which define a pair of belt paths 26, around each of which is circulating an endless belt 28. Pairs of belt paths 26 and pairs of belts 28 are arranged so as to define an article conveying channel 30. As each lane 16 has two side walls 20, each lane includes two pairs of belt paths 26, two pairs of belts 28, and therefore two article conveying channels 30. Articles 32 are preferably sheets of material such as printed circuit boards, and have two opposite side edges 33 which are received in the two article conveying channels 30. Each channel 30 has a width W which is substantially equal to the thickness T of articles 32, so that articles 32 are secured snugly within channels 30 so that undesired movement of articles 32 is minimized. Since printed circuit boards typically have sensitive components mounted thereon, channels 30 preferably contact articles 32 only at the very edges thereof, most preferably contacting only the outermost 1/16 of an inch of side edges 33.

Figure 5:
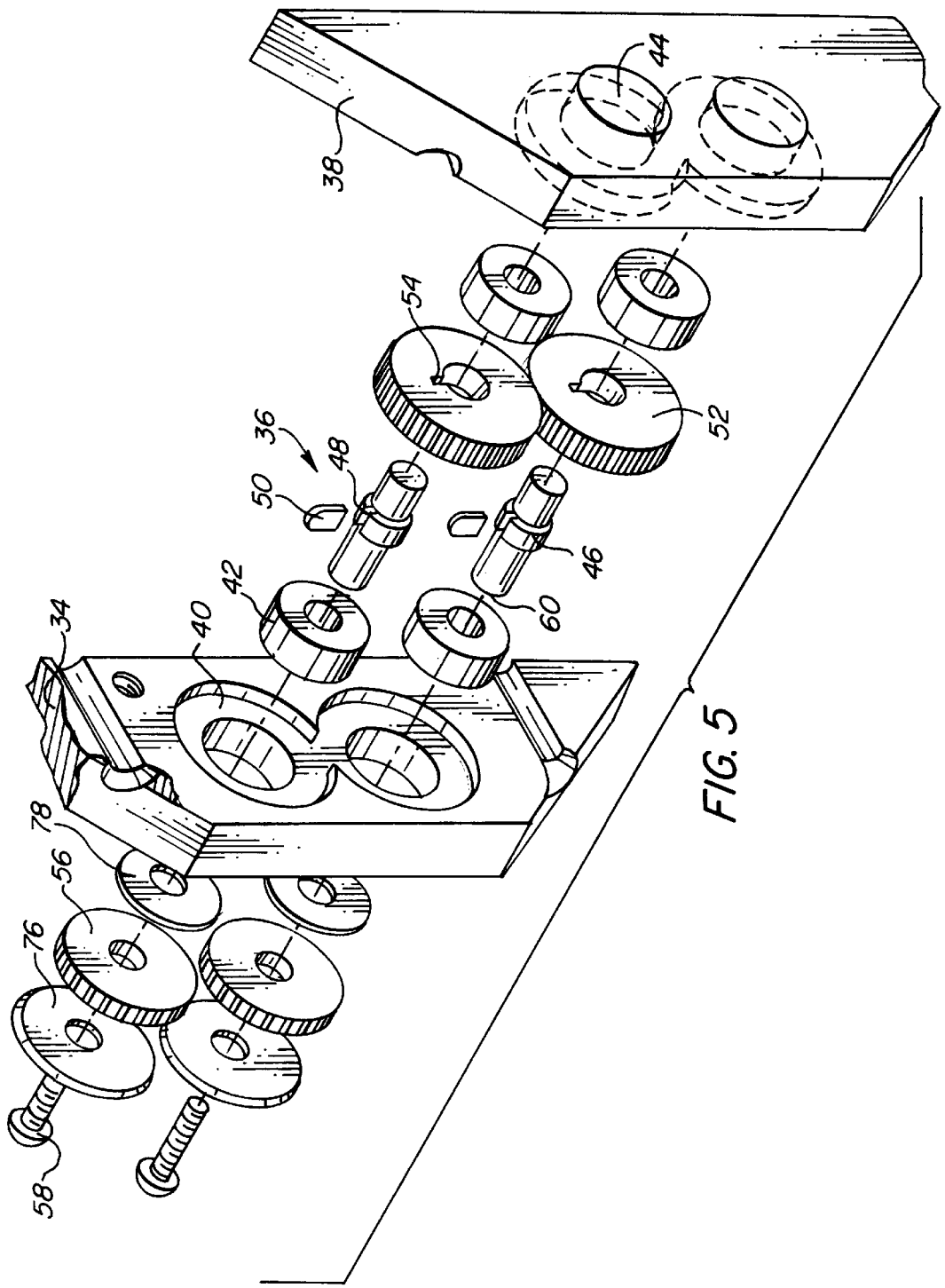
FIG. 5 is an exploded perspective view, partially cut away, of a portion one of the walls of the inverter of FIG. 1.
Figure 6:
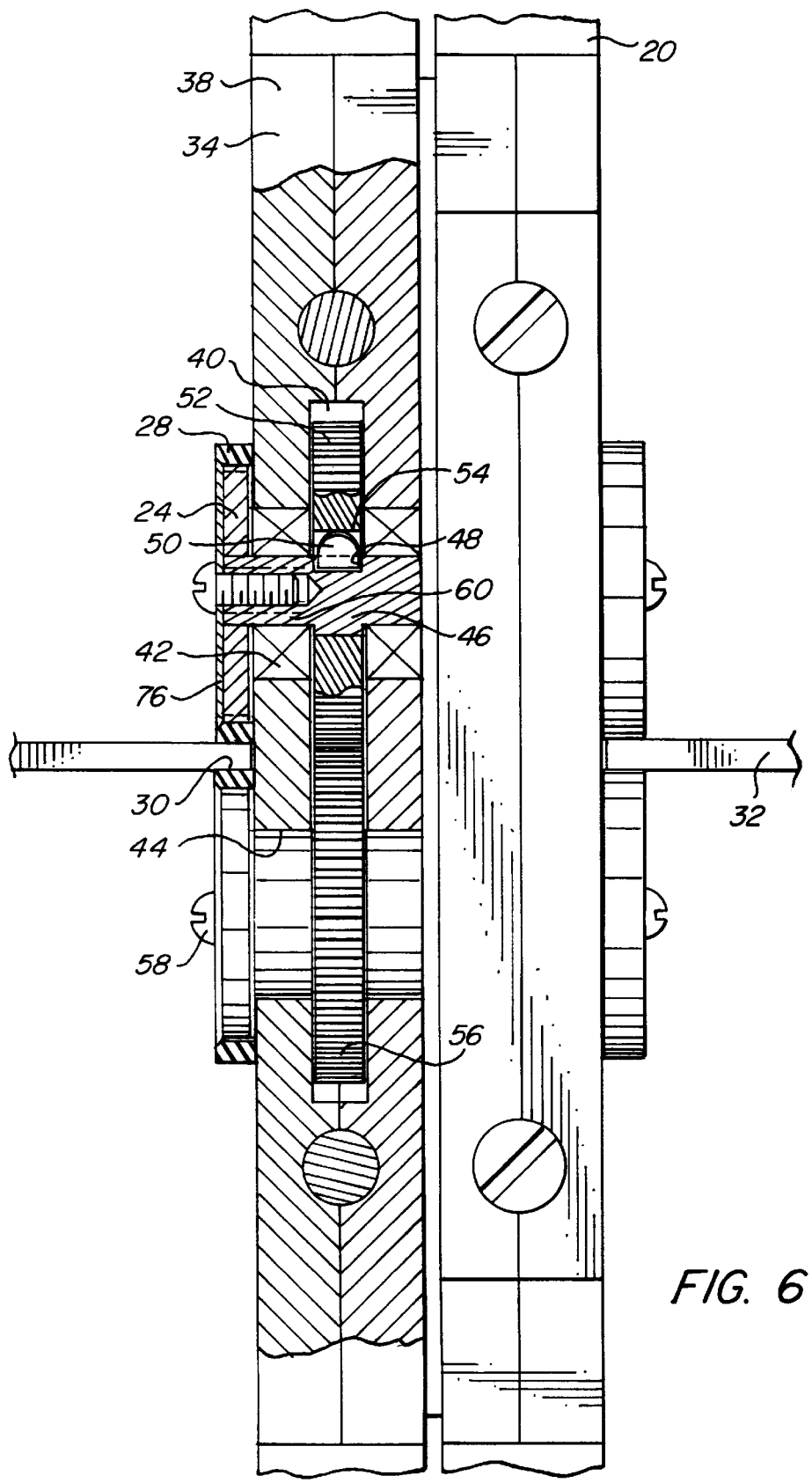
FIG. 6 is an end partial cross-sectional view of portions of two adjacent walls of two adjacent lanes of the inverter of FIG. 1 showing articles in the conveying channels.

Referring now to FIGS. 5 and 6, a portion 34 of side wall 20 and a jack drive assembly 36 are shown. As shown, portion 34 of side wall 20 is preferably divided into to two sections 38 to facilitate assembly of jack drive assembly 36, and preferably includes recesses 40 to accommodate portions of jack drive assembly 36. Jack drive assembly includes two pairs of bearings 42 which are mounted within holes 44 in sections 38. Shafts 46 are provided, which include grooves 48 to receive keys 50. Cooperating gears 52 are fit over shafts 46, with slots 54 in gears 52 receiving keys 50 to inhibit gears 52 from rotating on shaft 46, as is known in the art. Sections 38 of side wall portion 34 are joined together with shafts 46 and gears 52 therebetween, gears 52 being located within recesses 40. One of the rollers 24 defining one of a pair of belt paths 26 is attached to one of shafts 46, while one of the rollers 24 defining the other of the pair of belt paths 26 is attached to the other shaft 46 of the jack drive assembly 36. Such rollers 24 attached to shafts 46 are herein referred to as drive rollers 56. Drive rollers 56 may be attached to shafts 46, for example, by a threaded screw 56 passing through drive roller 56 and received by an internally threaded portion 58 of shaft 46.

Jack drive assembly 36 operates such that if one belt of a pair of belts 28 is driven, the other belt of the pair of belts 28 is driven at substantially the same velocity, but in an opposite direction, as illustrated by arrows in FIG. 4. It should be understood that although in the embodiment described above, gears 52 are housed within side walls 20, such an arrangement is not required. It is, however, preferable to have gears 52 located within side walls 20 so as to save space and allow for a distance between two adjacent lanes 16 of less than approximately two inches, and most preferably less than approximately one and ⅜ inches. It should also be understood that one pair of drive rollers 56 and jack drive assembly 36 may be used per article conveying channel 30, or more than one pair of drive rollers 56 and jack drive assemblies 36 may be used. In the embodiment shown in the figures, two pairs of drive rollers 56 and jack drive assemblies 36 are preferred, one being located at each end of article conveying channel 30.

Figure 2:
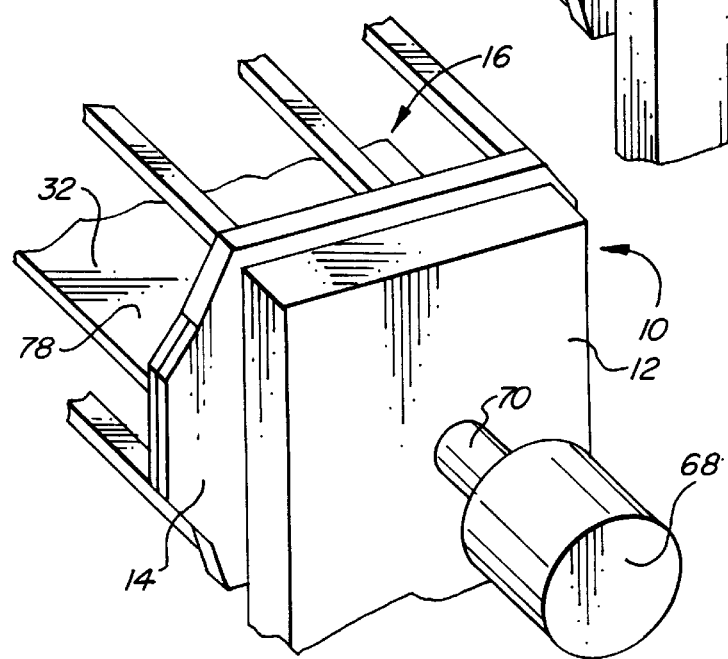
FIG. 2 is a perspective view of the inverter of FIG. 1 showing the flipping member having been rotated 180 degrees.

One of each pair of belts 28 is driven by a motor 62 mounted on flipping member 14, such that motor 62 rotates with flipping member 14. The belt 28 may be driven, for example by a powered roller 64 attached to a shaft 66 of motor 62. Motor 62 is mounted to flipping member 14 within a space defined horizontally by side walls 20, or in other words, horizontally within lanes 16. This positioning of motors 62 is desirable to achieve a reduced width of lanes 16 and of inverter 10 overall. Motors 62 are reversible, and may cause each belt 28 to rotate in either direction (i.e., clockwise or counterclockwise) about belt paths 26. Inverter 10 preferably also includes a flipping motor 68, which may be connected directly to flipping member 14 via a shaft 70 (as shown in FIGS. 1 and 2), or may be connected to flipping member 14 via a series of belts and pulleys. The latter arrangement may be desirable if further reduction of the inverter width is desired, as flipping motor 68 may be mounted under flipping member 14. Flipping motor 68 may be reversible or not as desired and as discussed more fully below.

FIGS. 1, 2 and 4 illustrate operation of inverter 10. Article 32 is fed into channel 32 from one side (i.e., the left side as shown in FIG. 4), preferably by components of the conveyor system in which inverter 10 operates, although article 32 may be manually fed. When article 32 contacts belts 28, which are being driven by motors 62 in a first direction (illustrated by arrows in FIG. 4), belts 28 grip edges 33 of article 32 and move article 32 in the direction illustrated by arrow 72. Belts 28 are driven until article 32 is located fully within channel 30. Once article 32 is located fully within channel 30, flipping motor rotates flipping member 14 by 180 degrees (illustrated by arrow 74 in FIG. 1), thereby causing upper side 76 of article 32 to face downward, and lower side 78 of article 32 to face upward (as shown in FIG. 2). Rotation may be clockwise (as shown) or counterclockwise. After flipping member 14 has been rotated, motors 62 are reversed, and belts 28 are driven in a second direction, opposite to the first direction described above, thereby causing article 32 to exit channel 30. It should be noted that article 32 thus exits flipping member 14 from the same side thereof which it entered, but that because flipping member has been rotated 180 degrees with respect to frame, article 32 exits the opposite side of frame 12 than that which it entered.

A second article may now be inverted. Either after article 32 exits flipping member 14, or while article 32 is exiting flipping member 14, a second article is loaded and inverted as described above. In one embodiment, where flipping motor 68 is reversible, flipping motor 68 rotates flipping member 14 180 degrees back in the direction opposite that in which flipping member 14 was rotated for the previous article. In another embodiment, which does not require a reversible flipping motor 68, flipping member 14 is again rotated in the same direction. It should be understood that although the above description refers to only a single article 32, each lane can accommodate one article 32, and thus the number of articles flipped at one time will correspond to the number of lanes 16.

Preferably, each drive roller 56 includes a belt guide 76 attached to an outer surface thereof, and a spacer 78 between drive roller 56 and side wall 20. Both belt guide 76 and spacer 78 may be attached to drive roller by threaded screw 58. As best seen in FIG. 6, belt guide 76 acts to inhibit belt 28 from slipping off drive roller 56 while belt 28 is being driven. Spacer 78 acts to space drive roller 56 from side wall 20 so that belt 28 is inhibited from contacting side wall 20 while belt 28 is being driven, which contact may cause friction, thereby damaging belt 28 and/or side wall 20. Most preferably, all rollers 24 include belt guides 76 and spacers 78.

Drive rollers 56 and power rollers 64 preferably comprise cogs or toothed rollers having grooves cut on the outer periphery thereof, and belts 28 preferably comprise timing belts or cogged belts having grooves cut on the inner periphery thereof which mesh with the grooves cut in drive rollers 56 and power rollers 64. Such an arrangement is desirable to provide a positive, no-slip constant-speed drive. Most preferably, all rollers 24 comprise cogs or toothed rollers.

Each of belt paths 26 preferably includes a belt tensioner 80, which comprises one of rollers 24 mounted on a shaft 82 which is slidably mounted within a channel 84 in side wall 20. Channel 84 is sized and oriented so that shaft 82 may be biased, preferably by a spring or the like, to slide within channel 84 in such a direction as to exert a force on belt 28, thereby causing belt 28 to be tensioned. Tension on belt 28 is desirable, as such tension inhibits slippage of belt 28 on rollers 24, particularly drive rollers 56 and power rollers 64.

The present invention, therefore, provides a dispensing pump for delivering measured quantities of a liquid which delivers the liquid in a uniform fine mist, which is low in profile, which has a low force to actuate, and which has a smooth feel during actuation.

Although the invention has been described with reference to a particular arrangement of parts, features and the like, these are not intended to exhaust all possible arrangements or features, and indeed many other modifications and variations will be ascertainable to those of skill in the art.

What is claimed is:

1. An inverter for flipping articles traveling on a conveyor system, the articles having two opposite side edges, the inverter comprising:

a frame member;

a flipping member mounted to said frame member, said flipping member having a plurality of substantially parallel lanes defined by side walls, said flipping member rotatable with respect to said frame member about an axis substantially perpendicular to the lanes;

a pair of belts circulating around a pair of belt paths on each of the side walls defining the lanes, each of the belt paths defined by a plurality of rollers mounted on one of the side walls, each pair of belts defining an article conveying channel for securing therebetween one of the side edges of the article;

at least one pair of drive rollers on each pair of belt paths, each pair of drive rollers defined by one roller from each belt path of each pair of belt paths; and a pair of cooperating gears for each pair of drive rollers, each gear of each pair of cooperating gears being operatively attached to a drive roller of each pair of drive rollers, such that if one belt of a pair of belts is driven, the other belt of the pair of belts is driven at substantially the same velocity, but in an opposite rotational direction.

2. The inverter of claim 1 wherein each of the side walls includes a recess therein for accommodating each of said pair of cooperating gears, and wherein each of said pair of cooperating gears is rotatably mounted within each recess in the side walls such that spacing between adjacent lanes may be minimized.

3. The inverter of claim 1 further comprising a plurality of drive motors mounted on said flipping member, each of said drive motors driving a pair of belts.

4. The inverter of claim 3 wherein each of said drive motors is mounted on said flipping member within a space defined horizontally by the side walls of the lane which each motor is driving.

5. The inverter of claim 3 wherein said drive motors rotate with said flipping member.

6. The inverter of claim 3 wherein said drive motors are reversible so that an article may enter said flipping member from one end, flipping member may be rotated 180 degrees, and the article may exit said flipping member from the same end at which the article entered.

7. The inverter of claim 1 further comprising a flipping motor for rotating said flipping member.

8. The inverter of claim 1 wherein each of the belt paths further comprises a belt tensioner for inhibiting slippage of said belts.

9. The inverter of claim 1 wherein the drive rollers comprise toothed rollers, and wherein said belts comprise timing belts cooperating with the toothed rollers.

10. The inverter of claim 1 wherein the rollers comprise toothed rollers, and wherein said belts comprise timing belts cooperating with the toothed rollers.

11. An inverter for flipping articles traveling on a conveyor system, the articles having two opposite side edges, the inverter comprising:

a frame member;

a flipping member mounted to said frame member, said flipping member having a plurality of substantially parallel lanes defined by side walls, said flipping member rotatable with respect to said frame member about an axis substantially perpendicular to the lanes;

a pair of belts circulating around a pair of belt paths on each of the side walls defining the lanes, each of the belt paths defined by a plurality of rollers mounted on one of the side walls, each pair of belts defining an article conveying channel for securing therebetween one of the side edges of the article;

at least one pair of drive rollers on each pair of belt paths, each pair of drive rollers defined by one roller from each belt path of each pair of belt paths;

a pair of cooperating gears for each pair of drive rollers, each gear of each pair of cooperating gears being operatively attached to a drive roller of each pair of drive rollers, such that if one belt of a pair of belts is driven, the other belt of the pair of belts is driven at substantially the same velocity, but in an opposite rotational direction, each pair of cooperating gears being rotatably mounted within a recess formed in one the side walls such that spacing between adjacent lanes may be minimized;

a plurality of drive motors, each of said drive motors driving a pair of belts, and being mounted on said flipping member within a space defined horizontally by the side walls of the lane which each motor is driving; and a flipping motor for rotating said flipping member.

12. The inverter of claim 11 wherein the drive motors rotate with said flipping member.

13. The inverter of claim 11 wherein the drive motors are reversible so that an article may enter said flipping member from one end, flipping member may be rotated 180 degrees, and the article may exit said flipping member from the same end at which the article entered.

14. The inverter of claim 11 wherein each of the belt paths further comprises a belt tensioner for inhibiting slippage of said belts.

15. The inverter of claim 11 wherein the drive rollers comprise toothed rollers, and wherein said belts comprise timing belts cooperating with the toothed rollers.

16. The inverter of claim 11 wherein the rollers comprise toothed rollers, and wherein said belts comprise timing belts cooperating with the toothed rollers.

17. An inverter for flipping articles traveling on a conveyor system, the articles having two opposite side edges, the inverter comprising:

a frame member;

a flipping member mounted to said frame member, said flipping member having a plurality of substantially parallel lanes defined by side walls, said flipping member rotatable with respect to said frame member about an axis substantially perpendicular to the lanes;

a pair of toothed belts circulating around a pair of belt paths on each of the side walls defining the lanes, each of the belt paths defined by a plurality of toothed rollers mounted on one of the side walls and by a belt tensioner for inhibiting slippage of said toothed belts, each pair of toothed belts defining an article conveying channel for securing therebetween one of the side edges of the article;

at least one pair of drive rollers on each pair of belt paths, each pair of drive rollers defined by one toothed roller from each belt path of each pair of belt paths;

a pair of cooperating gears for each pair of drive rollers, each gear of each pair of cooperating gears being operatively attached to a drive roller of each pair of drive rollers, such that if one toothed belt of a pair of toothed belts is driven, the other toothed belt of the pair of toothed belts is driven at substantially the same velocity, but in an opposite rotational direction, each pair of cooperating gears being rotatably mounted within a recess formed in one the side walls such that spacing between adjacent lanes may be minimized;

a plurality of drive motors, each of said drive motors driving a pair of belts, and being mounted on said flipping member within a space defined horizontally by the side walls of the lane which each motor is driving, said drive motors rotating with said flipping member and being reversible so that an article may enter said flipping member from one end, flipping member may be rotated 180 degrees, and the article may exit said flipping member from the same end at which the article entered; and a flipping motor for rotating said flipping member.

* * * * *